(12) United States Patent
Goolsby et al.

(10) Patent No.: US 11,923,026 B2
(45) Date of Patent: Mar. 5, 2024

(54) DATA STORAGE SYSTEM WITH INTELLIGENT ERROR MANAGEMENT

(71) Applicant: Seagate Technology LLC, Fremont, CA (US)

(72) Inventors: Jeremy B. Goolsby, Longmont, CO (US); Ryan J. Goss, Prior Lake, MN (US); Indrajit Prakash Zagade, Maharashtra (IN); Thomas V. Spencer, Ft. Collins, CO (US); Jeffrey J. Pream, Berthoud, CO (US); Christopher A. Smith, Fremont, CA (US); Charles McJilton, Longmont, CO (US)

(73) Assignee: Seagate Technology LLC, Fremont, CA (US)

( * ) Notice: Subject to any disclaimer, the term of this patent is extended or adjusted under 35 U.S.C. 154(b) by 338 days.

(21) Appl. No.: 17/394,738

(22) Filed: Aug. 5, 2021

(65) Prior Publication Data

US 2022/0044754 A1    Feb. 10, 2022

Related U.S. Application Data

(60) Provisional application No. 62/706,216, filed on Aug. 5, 2020.

(51) Int. Cl.
| | | |
|---|---|---|
| *G11C 29/00* | (2006.01) | |
| *G06F 11/07* | (2006.01) | |
| *G06F 11/30* | (2006.01) | |
| *G11C 29/12* | (2006.01) | |
| *G11C 29/18* | (2006.01) | |
| *G11C 29/42* | (2006.01) | |
| *G11C 29/44* | (2006.01) | |

(52) U.S. Cl.
CPC ............ *G11C 29/42* (2013.01); *G06F 11/073* (2013.01); *G06F 11/0766* (2013.01); *G06F 11/3037* (2013.01); *G11C 29/12005* (2013.01); *G11C 29/18* (2013.01); *G11C 29/4401* (2013.01)

(58) Field of Classification Search
CPC ... G11C 29/42; G11C 29/12005; G11C 29/18; G11C 29/4401; G06F 11/073; G06F 11/0766; G06F 11/3037
See application file for complete search history.

(56) References Cited

U.S. PATENT DOCUMENTS

| | | |
|---|---|---|
| 7,162,376 B2 | 1/2007 | Oh et al. |
| 8,213,255 B2 | 7/2012 | Hemink et al. |
| 8,423,791 B1 | 4/2013 | Yu et al. |
| 9,076,545 B2 | 7/2015 | Mokhlesi |
| 9,400,749 B1 | 7/2016 | Kuzmin et al. |
| 9,507,719 B2 | 11/2016 | Venkata |

(Continued)

*Primary Examiner* — Christine T. Tu
(74) *Attorney, Agent, or Firm* — Hall Estill Law Firm (57) ABSTRACT

A data storage system may connect a non-volatile memory to a quarantine module that generates a quarantine strategy in response to a pending data access request to the non-volatile memory. The quarantine strategy can proactively prescribing a plurality of status levels for physical data addresses of the non-volatile memory. A comparison of a volume of errors for the non-volatile memory to a first threshold of the quarantine strategy with the quarantine module may prompt the alteration of a first status level of the plurality of status levels for a first physical data address of the non-volatile memory, as directed by the quarantine strategy.

20 Claims, 7 Drawing Sheets

(56) References Cited

U.S. PATENT DOCUMENTS

| | | |
|---|---|---|
| 2014/0052897 A1 | 2/2014 | Goss et al. |
| 2015/0227414 A1 | 8/2015 | Varma |
| 2016/0055910 A1* | 2/2016 | Tuers ................. G11C 29/4401 |
| | | 365/185.11 |
| 2018/0053562 A1* | 2/2018 | Reusswig ........... G11C 16/0483 |
| 2018/0074885 A1* | 3/2018 | Giloni .................. G06F 3/0673 |
| 2020/0000467 A1 | 1/2020 | Perlmutter et al. |

* cited by examiner

DATA STORAGE SYSTEM WITH INTELLIGENT ERROR MANAGEMENT

RELATED APPLICATION

The present application makes a claim of domestic priority to U.S. Provisional Application No. 62/706,216 filed Aug. 5, 2020, the contents of which are hereby incorporated by reference.

SUMMARY

Various embodiments of the present disclosure are generally directed to the management of errors in a memory, such as, but not limited to, a flash memory in a solid state drive (SSD).

In accordance with various embodiments, a non-volatile memory is connected to a quarantine module that generates a quarantine strategy in response to a pending data access request to the non-volatile memory. The quarantine strategy proactively prescribes a plurality of status levels for physical data addresses of the non-volatile memory. The quarantine module alters a status level of the plurality of status levels for a physical data address of the non-volatile memory in response to a volume of errors for the physical data address compared to a threshold number of errors, as directed by the quarantine strategy.

A data storage system, in some embodiments, has a non-volatile memory connected to a quarantine module that generates a quarantine strategy in response to a pending data access request to the non-volatile memory. The quarantine strategy proactively prescribes a plurality of status levels for physical data addresses of the non-volatile memory. A comparison of a volume of errors for the non-volatile memory to a first threshold of the quarantine strategy with the quarantine module prompts the alteration of a first status level of the plurality of status levels for a first physical data address of the non-volatile memory, as directed by the quarantine strategy. A second status level of the plurality of status levels for a second physical data address of the non-volatile memory is changed, as directed by the quarantine strategy, in response to the comparison of errors to a second threshold with the first and second status levels conducted concurrently by the quarantine module.

Other embodiments connect a non-volatile memory to a quarantine module that generates a quarantine strategy in response to a pending data access request to the non-volatile memory with the quarantine strategy proactively prescribing a plurality of status levels for physical data addresses of the non-volatile memory. The prediction of an expense of a volume of system resources with the quarantine module allows a comparison of the predicted volume of system resources to a first threshold of the quarantine strategy with the quarantine module. A first status level of the plurality of status levels for a first physical data address of the non-volatile memory is altered, as directed by the quarantine strategy, in response to the comparison of the expense of the volume of system resources to the first threshold.

DETAILED DESCRIPTION

The various embodiments disclosed herein, without limitation, are generally directed to detecting errors and managing memory to maintain optimized data storage performance.

Solid state drives (SSDs) are data storage devices that store user data in non-volatile memory (NVM) made up of an array of solid-state semiconductor memory cells. SSDs usually have an NVM module and a controller. The controller controls the transfer of data between the NVM and a host device. The NVM will usually be NAND flash memory, but other forms of solid-state memory can be used.

A flash memory module may be arranged as a series of dies. A die represents a separate, physical block of semiconductor memory cells. The controller communicates with the dies using a number of channels, or lanes, with each channel connected to a different subset of the dies. Any respective numbers of channels and dies can be used. Groups of dies may be arranged into NVMe sets in accordance with the NVMe (Non-Volatile Memory Express) Standard. This standard enables multiple owners (users) to access and control separate portions of a given SSD (or other memory device).

Metadata is often generated and used to describe and control the data stored to an SSD. The metadata may take the form of one or more map structures that track the locations of data blocks written to various GCUs (garbage collection units), which are sets of erasure blocks that are erased and allocated as a unit. The map structures can include a forward map and a reverse directory, although other forms can be used.

The forward map provides an overall map structure that can be accessed by a controller to service a received host access command (e.g., a write command, a read command, etc.). The forward map may take the form of a two-level map, where a first level of the map maintains the locations of map pages and a second level of the map provides a flash transition layer (FTL) to provide association of logical addresses of the data blocks to physical addresses at which the blocks are stored. Other forms of maps can be used including single level maps and three-or-more level maps, but each generally provides a forward map structure in which pointers may be used to point to each successive block until the most current version is located.

The reverse directory can be written to the various GCUs and provides local data identifying, by logical address, which data blocks are stored in the associated GCU. The reverse directory, also sometimes referred to as a footer, thus provides a physical to logical association for the locally stored blocks. As with the forward map, the reverse directory can take any number of suitable forms. Reverse directories are particularly useful during garbage collection operations, since a reverse directory can be used to determine which data blocks are still current and should be relocated before the associated erasure blocks in the GCU are erased.

SSDs expend a significant amount of resources on maintaining accurate and up-to-date map structures. Nevertheless, it is possible from time to time to have a mismatch between the forward map and the reverse directory for a given GCU. These situations are usually noted at the time of garbage collection. For example, the forward map may indicate that there are X valid data blocks in a given erasure block (EB), but the reverse directory identifies a different number Y valid blocks in the EB. When this type of mismatch occurs, the garbage collection operation may be rescheduled or may take a longer period of time to complete while the system obtains a correct count before proceeding with the recycling operation.

The NVMe specification provides that a storage device should have the ability to provide guaranteed levels of deterministic performance for specified periods of time (deterministic windows, or DWs). To the extent that a garbage collection operation is scheduled during a DW, it is desirable to ensure that the actual time that the garbage collection operation would require to complete is an accurate estimate in order for the system to decide whether and when to carry out the GC operation.

SSDs include a top level controller circuit and a flash (or other semiconductor) memory module. A number of channels, or lanes, are provided to enable communications between the controller and dies within the flash memory. The dies are further subdivided into planes, GCUs, erasure blocks, pages, etc. Groups of dies may be arranged into separate NVMe sets, or namespaces. This allows the various NVMe sets to be concurrently serviced for different owners (users).

In one nonlimiting example, a 4 TB SSD has 128 die connected using 8 channels so that 16 die are connected to each channel. Each die has two planes that support concurrent read or write operations to the same page number (but not necessarily the same erasure blocks, EBs). GCUs nominally are formed using one EB from each of 32 dies. Each page stores 16K of data plus LDPC inner code values. GCU writes are thus formed by writing (nominally) 31 pages of user data, and one page of parity (XOR) data. This will support a loss of a single die. EBs represent the smallest increment of memory that can be erased as a unit, but in practice, garbage collection takes place at the GCU level.

Flash devices can be noisy and thus it is common to write data in the form of code words to individual pages of data. A page may store 16K worth of user payload data, plus some additional number of LDPC (low density parity check) codes, which may be on the order of an additional 5K or so bits. The number and strength of the LDPC codes are used to enable, normally, correct reading back of the payload. Outercode, or parity values, can additionally be written as noted above to correct read errors when the inner code values are insufficient to resolve the error.

While the ability to correct errors can be incorporated into data stored in a memory, the actual recovery of data after an encountered error can be detrimental to the data access and storage performance of a data storage system. That is, the discovery of an error and subsequent actions to allow data associated with the error to be recovered occupy time and system resources that would otherwise be available to satisfy data access requests from one or more hosts. The presence of numerous different data access requests from several different hosts can exacerbate the frequency of errors as well as the data access performance degradation corresponding to recovering the data and/or data locations that encountered an error. With the structural configuration of flash memory, as well as other solid-state memories, that access multiple memory locations via a single bit line, such as a page of memory, an error to a single memory location restricts, or at least delays, access to the remaining memory locations of the bit line until the error is recovered.

When excessive errors are detected in some memories, such as flash and other solid-state memories, portions of the memory are scanned and evaluated for operational reliability and future accuracy. A scan of memory can be highly resource intensive as processing, buffers, and memory are utilized to evaluate the operational quality of various granularities of memory, such as individual memory cells, pages, die, and GCUs. For example, a scan may conduct one or more tests to determine if the reference voltage (Vref) for a memory cell accurately corresponds to the distinction of data bits, which may change over time with the programming and erasing of memory through normal data storage operations. The presence of memory with multiple levels that concurrently store different data bits further exacerbates the intensity of a memory scan and the time necessary to develop a strategy of handling the results of the scan to provide reduced data access errors.

Accordingly, embodiments of a distributed data storage system are configured to intelligently handle the presence of errors to a memory by applying a hierarchical management protocol that delays the application of a memory scan until unavoidably necessary. The intelligent application of actions to a memory to quell the occurrence of data access errors can allow system resources to be utilized to provide optimal data storage performance. In the event a portion of memory experiences excessive errors despite corrective actions, some embodiments conduct intelligent quarantining and correction of memory in an effort to regain the portion of memory as a viable data repository. However, the presence of uncorrectable memory operation can be accommodated through intelligent exclusion that minimizes the data storage performance of the remaining, viable memory.

Figure 1:
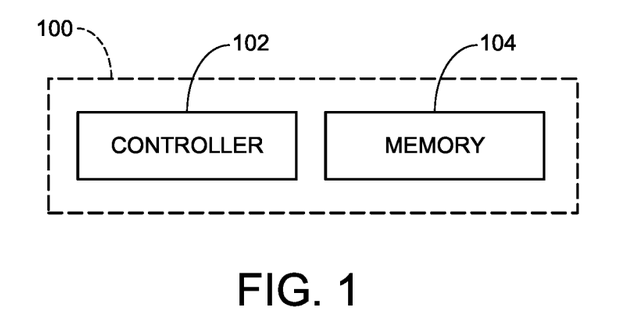
FIG. 1 provides a functional block representation of a data storage device in accordance with various embodiments.

These and other features may be practiced in a variety of different data storage devices, but various embodiments conduct wear range optimization in the example data storage device 100 shown as a simplified block representation in FIG. 1. The device 100 has a controller 102 and a memory module 104. The controller block 102 represents a hardware-based and/or programmable processor-based circuit configured to provide top level communication and control functions. The memory module 104 includes solid state non-volatile memory (NVM) for the storage of user data from one or more host devices 106, such as other data storage devices, network server, network node, or remote controller.

Figure 2:
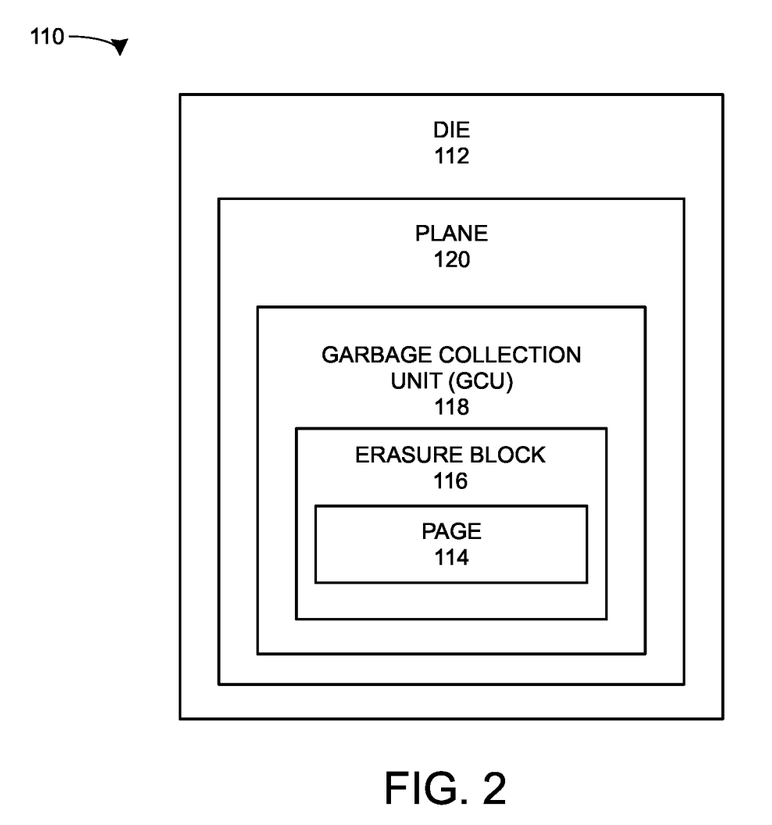
FIG. 2 shows aspects of the device of FIG. 1 characterized as a solid state drive (SSD) in accordance with some embodiments.

FIG. 2 shows a block representation of portions of an example memory 110 arranged in accordance with some embodiments. A memory die 112 can be configured with any solid-state memory cells, such as flash, resistive, phase change, and spin-torque memory, without limitation. The smallest unit of memory that can be accessed at a time is referred to as a page 114. A page 114 may be formed using a number of solid-state memory cells that share a common word line, bit line, or source line. The storage size of a page 114 can vary; current generation flash memory pages can store, in some cases, 16 KB (16,384 bytes) of user data.

A number of pages are integrated into an erasure block 116, which represents the smallest grouping of memory cells that can be concurrently erased in a NAND flash memory. A number of erasure blocks 116 can be arranged into a garbage collection unit (GCU) 118, which may utilize erasure blocks across different dies 112, as explained below. GCUs 118 can be allocated for the storage of data. Once a sufficient amount of the stored data is determined to be stale (e.g., no longer the most current version), a garbage collection operation can be carried out to recycle the GCU 118. This includes identifying and relocating the current version data to a new location, followed by an erasure operation to reset the memory cells. The GCU 118 may then be returned to an allocation pool for subsequent allocation to begin storing new user data.

Each die 112 may include a plurality of planes 120. Examples include two planes per die, four planes per die, etc. although other arrangements can be used. Generally, a plane is a subdivision of the die 112 arranged with separate read/write/erase circuitry such that a given type of access operation (such as a write operation, etc.) can be carried out simultaneously by each of the planes to a common page address within the respective planes.

Figure 3:
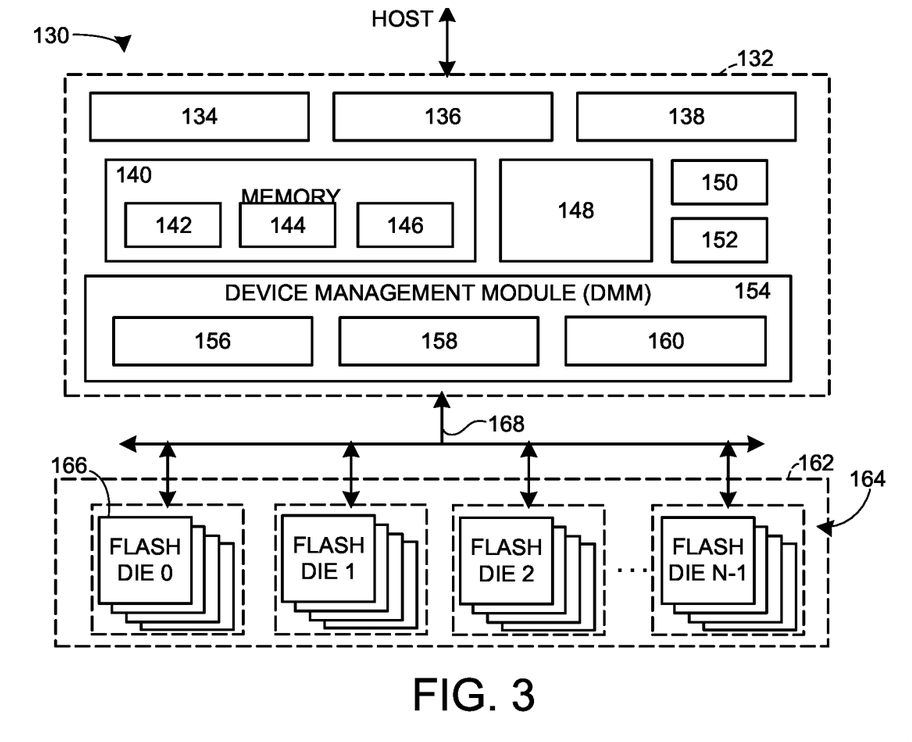
FIG. 3 shows an arrangement of the flash memory of FIG. 2 in some embodiments.

FIG. 3 depicts portions of an example data storage device 130 generally corresponding to the device 100 in FIG. 1. The device 130 is configured as a solid state drive (SSD) that communicates with one or more host devices via one or more Peripheral Component Interface Express (PCIe) ports, although other configurations can be used. The NVM is contemplated as comprising NAND flash memory, although other forms of solid state non-volatile memory can be used.

In at least some embodiments, the SSD operates in accordance with the NVMe (Non-Volatile Memory Express) Standard, which enables different users to allocate NVMe sets (die sets) for use in the storage of data. Each NVMe set may form a portion of an NVMe Namespace that may span multiple SSDs or be contained within a single SSD.

The SSD 130 includes a controller circuit 132 with a front end controller 134, a core controller 136 and a back end controller 138. The front end controller 134 performs host I/F functions, the back end controller 138 directs data transfers with the memory module 134 and the core controller 136 provides top level control for the device.

Each controller 134, 136 and 138 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can also be used. The various controllers may be integrated into a single system on chip (SOC) integrated circuit device, or may be distributed among various discrete devices as required.

A controller memory 140 represents various forms of volatile and/or non-volatile memory (e.g., SRAM, DDR DRAM, flash, etc.) utilized as local memory by the controller 132. Various data structures and data sets may be stored by the memory including one or more map structures 142, one or more caches 144 for map data and other control information, and one or more data buffers 146 for the temporary storage of host (user) data during data transfers.

A non-processor based hardware assist circuit 148 may enable the offloading of certain memory management tasks by one or more of the controllers as required. The hardware circuit 148 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in hardware and/or firmware in the controller 132, such as a data compression block 150 and an encryption block 152. The data compression block 150 applies lossless data compression to input data sets during write operations, and subsequently provides data de-compression during read operations. The encryption block 152 provides any number of cryptographic functions to input data including encryption, hashes, decompression, etc.

A device management module (DMM) 154 supports back end processing operations and may include an outer code engine circuit 156 to generate outer code, a device I/F logic circuit 158 and a low density parity check (LDPC) circuit 160 configured to generate LDPC codes as part of the error detection and correction strategy used to protect the data stored by the by the SSD 130.

A memory module 162 corresponds to the memory 104 in FIG. 1 and includes a non-volatile memory (NVM) in the form of a flash memory 164 distributed across a plural number N of flash memory dies 166. Rudimentary flash memory control electronics (not separately shown in FIG. 3) may be provisioned on each die 166 to facilitate parallel data transfer operations via one or more channels (lanes) 168.

Figure 4:
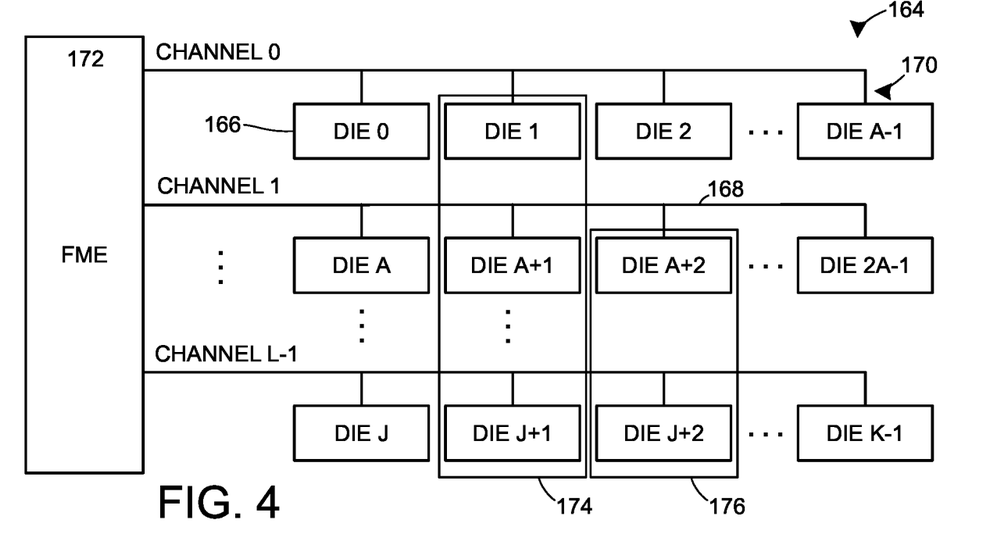
FIG. 4 illustrates the use of channels to access the dies in FIG. 3 in some embodiments.

FIG. 4 shows further aspects of the flash memory 164 arranged in accordance with some embodiments. A total number K dies 166 are provided and arranged into physical die groups 170. Each die group 170 is connected to a separate channel 168 using a total number of L channels. In one example, K is set to 128 dies, L is set to 8 channels, and each physical die group has 16 dies. As noted above, a single die within each physical die group can be accessed at a time using the associated channel. A flash memory electronics (FME) circuit 172 of the flash memory 164 controls each of the channels 168 to transfer data to and from the dies 166.

In some embodiments, the various dies are arranged into one or more NVMe sets. An NVMe set represents a portion of the storage capacity of the SSD that is allocated for use by a particular host (user/owner). NVMe sets are usually established with a granularity at the die level, so that some percentage of the total available dies 166 will be allocated for incorporation into a given NVMe set.

A first example NVMe set is denoted at 174 in FIG. 4. This first set 174 uses a single die 166 from each of the different channels 168. This arrangement provides fast performance during the servicing of data transfer commands for the set since all eight channels 168 are used to transfer the associated data. A limitation with this approach is that if the set 174 is being serviced, no other NVMe sets can be serviced during that time interval. While the set 174 only uses a single die from each channel, the set could also be configured to use multiple dies from each channel, such as 16 dies/channel, 32 dies/channel, etc.

A second example NVMe set is denoted at 176 in FIG. 4. This set uses dies 166 from less than all of the available channels 168. This arrangement provides relatively slower overall performance during data transfers as compared to the set 174, since for a given size of data transfer, the data will be transferred using fewer channels. However, this arrangement advantageously allows the SSD to service multiple NVMe sets at the same time, provided the sets do not share the same (e.g., an overlapping) channel 168.

Figure 5:
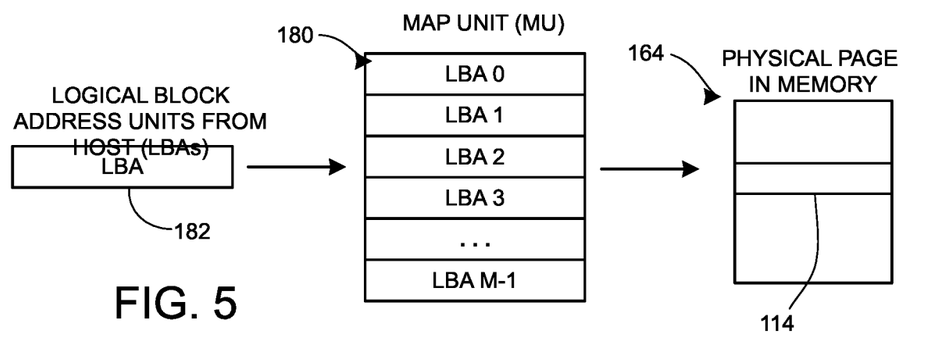
FIG. 5 illustrates a map unit (MU) as a data arrangement stored to the flash memory of FIG. 2.

FIG. 5 illustrates a manner in which data may be stored to a flash memory 164. Map units (MUs) 180 represent fixed sized blocks of data that are made up of one or more user logical block address units (LBAs) 182 supplied by the host. Without limitation, the LBAs 182 may have a first nominal size, such as 512 bytes (B), 1024 B (1 KB), etc., and the MUs 180 may have a second nominal size, such as 4096 B (4 KB), etc. The application of data compression may cause each MU to have a smaller size in terms of actual bits written to the flash memory 164.

The MUs 180 are arranged into the aforementioned pages 114 (FIG. 2) which are written to the memory 164. In the present example, using an MU size of 4 KB, then nominally four (4) MUs may be written to each page. Other configurations can be used. To enhance data density, multiple pages worth of data may be written to the same flash memory cells connected to a common control line (e.g., word line) using multi-bit writing techniques; MLCs (multi-level cells) write two bits per cell, TLCs (three-level cells) write three bits per cell; XLCs (four level cells) write four bits per cell, etc.

Data stored by an SSD are often managed using metadata. The metadata provide map structures to track the locations of various data blocks (e.g., MUAs 180) to enable the SSD 130 to locate the physical location of existing data. For example, during the servicing of a read command it is generally necessary to locate the physical address within the flash memory 166 at which the most current version of a requested block (e.g., LBA) is stored, so that the controller can schedule and execute a read operation to return the requested data to the host. During the servicing of a write command, new data are written to a new location, but it is still necessary to locate the previous data blocks sharing the same logical address as the newly written block so that the metadata can be updated to mark the previous version of the block as stale and to provide a forward pointer or other information to indicate the new location for the most current version of the data block.

Figure 6:
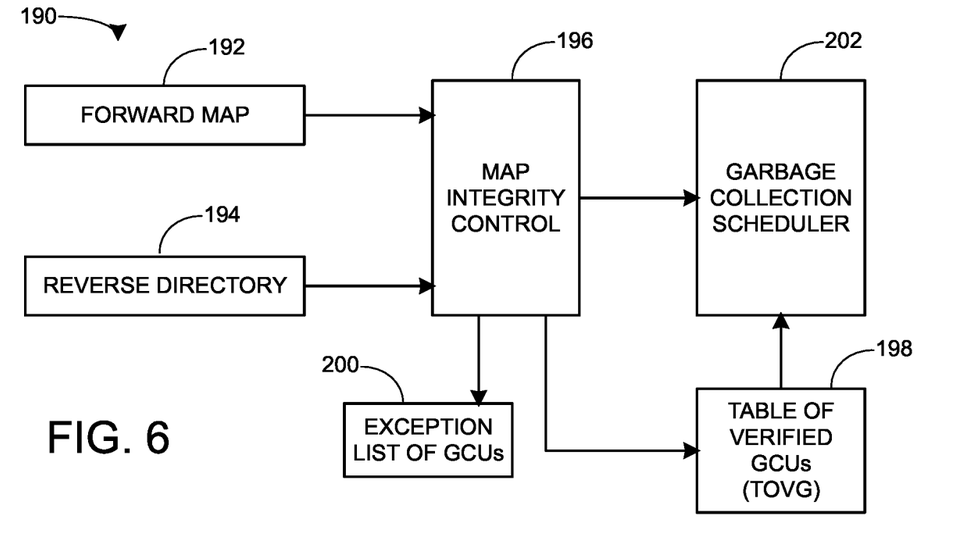
FIG. 6 displays a functional block diagram for a GCU management circuit of the SSD in accordance with some embodiments.

FIG. 6 shows a functional block diagram for a GCU management circuit 190 of the SSD 130 in accordance with some embodiments. The circuit 190 may form a portion of the controller 132 and may be realized using hardware circuitry and/or one or more programmable processor circuits with associated firmware in memory. The circuit 190 includes the use of a forward map 192 and a reverse directory 194. As noted above, the forward map and reverse directory are metadata data structures that describe the locations of the data blocks in the flash memory 164. During the servicing of host data transfer operations, as well as other operations, the respective portions of these data structures are located in the flash memory or other non-volatile memory location and copied to local memory 140 (see e.g., FIG. 3).

The forward map 192 provides a flash transition layer (FTL) to generally provide a correlation between the logical addresses of various blocks (e.g., MUAs) and the physical addresses at which the various blocks are stored (e.g., NVMe set, die, plane, GCU, EB, page, bit offset, etc.). The contents of the forward map 192 may be stored in specially configured and designated GCUs in each NVMe set.

The reverse directory 194 provides a physical address to logical address correlation. The reverse directory contents may be written as part of the data writing process to each GCU, such as in the form of a header or footer along with the data being written. Generally, the reverse directory provides an updated indication of how many of the data blocks (e.g., MUAs) are valid (e.g., represent the most current version of the associated data).

The circuit 190 further includes a map integrity control circuit 196. As explained below, this control circuit 196 generally operates at selected times to recall and compare, for a given GCU, the forward map data and the reverse directory data. This evaluation step includes processing to determine if both metadata structures indicate the same number and identify of the valid data blocks in the GCU.

If the respective forward map and reverse directory match, the GCU is added to a list of verified GCUs in a data structure referred to as a table of verified GCUs, or TOVG 198. The table can take any suitable form and can include a number of entries, with one entry for each GCU. Each entry can list the GCU as well as other suitable and useful information, such as but not limited to a time stamp at which the evaluation took place, the total number of valid data blocks that were determined to be present at the time of validation, a listing of the actual valid blocks, etc.

Should the control circuit 196 find a mismatch between the forward map 192 and the reverse directory 194 for a given GCU, the control circuit 196 can further operate to perform a detailed evaluation to correct the mismatch. This may include replaying other journals or other data structures to trace the history of those data blocks found to be mismatched. The level of evaluation required will depend on the extent of the mismatch between the respective metadata structures.

For example, if the forward map 192 indicates that there should be some number X valid blocks in the selected GCU, such as 12 valid blocks, but the reverse directory 194 indicates that there are only Y valid blocks, such as 11 valid blocks, and the 11 valid blocks indicated by the reverse directory 194 are indicated as valid by the forward map, then the focus can be upon the remaining one block that is valid according to the forward map but invalid according to the reverse directory. Other mismatch scenarios are envisioned.

The mismatches can arise due to a variety of factors such as incomplete writes, unexpected power surges or disruptions that prevent a full writing of the state of the system, etc. Regardless, the control circuit can expend the resources as available to proactively update the metadata. In some embodiments, an exception list 200 may be formed as a data structure in memory of GCUs that have been found to require further evaluation. In this way, the GCUs can be evaluated later at an appropriate time for resolution, after which the corrected GCUs can be placed on the verified list in the TOVG 198.

It will be noted that the foregoing operation of the control circuit 196 in evaluating GCUs does not take place once a garbage collection operation has been scheduled; instead, this is a proactive operation that is carried out prior to the scheduling of a garbage collection operation. In some cases, GCUs that are approaching the time at which a garbage collection operation may be suitable, such as after the GCU has been filled with data and/or has reached a certain aging limit, etc., may be selected for evaluation on the basis that it can be expected that a garbage collection operation may be necessary in the relatively near future.

FIG. 6 further shows the GCU management circuit 190 to include a garbage collection scheduler circuit 202. This circuit 202 generally operates once it is appropriate to consider performing a garbage collection operation, at which point the circuit 202 selects from among the available verified GCUs from the table 198. In some cases, the circuit 202 may generate a time of completion estimate to complete the garbage collection operation based on the size of the GCU, the amount of data to be relocated, etc.

As will be appreciated, a garbage collection operation can include accessing the forward map and/or reverse directory 192, 194 to identify the still valid data blocks, the reading out and temporary storage of such blocks in a local buffer memory, the writing of the blocks to a new location such as in a different GCU, the application of an erasure operation to erase each of the erasure blocks in the GCU, the updating of program/erase count metadata to indicate the most recent erasure cycle, and the placement of the reset GCU into an allocation pool awaiting subsequent allocation and use for the storage of new data sets.

Figure 7:
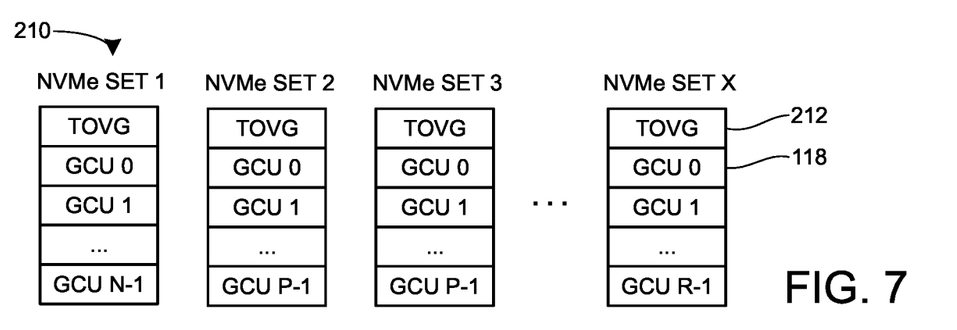
FIG. 7 represents an arrangement of various GCUs and corresponding tables of verified GCUs (TOVGs) for a number of different NVMe sets in some embodiments.

FIG. 7 shows a number of NVMe sets 210 that may be arranged across the SSD 130 in some embodiments. Each set 210 may have the same nominal data storage capacity (e.g., the same number of allocated dies, etc.), or each may have a different storage capacity. The storage capacity of each NVMe set 210 is arranged into a number of GCUs 118 as shown. In addition, a separate TOVG (table of verified GCUs) 212 may be maintained by and in each NVMe set 210 to show the status of the respective GCUs. From this, each time that it becomes desirable to schedule a garbage collection operation, such as to free up new available memory for a given set, the table 212 can be consulted to select a GCU that, with a high degree of probability, can be subjected to an efficient garbage collection operation without any unexpected delays due to mismatches in the metadata (forward map and reverse directory).

Figure 8:
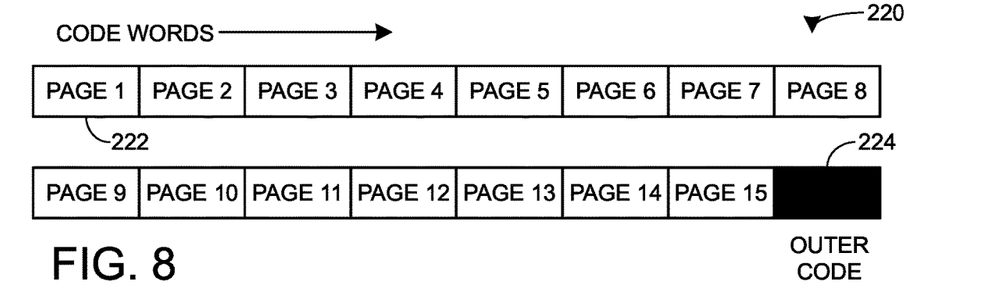
FIG. 8 illustrates an example data set that can be written to the data storage device of FIG. 1 in accordance with assorted embodiments.

FIG. 8 illustrates a manner in which a parity data set 220 can be written to a selected GCU 118 in the flash memory 164 in accordance with some embodiments. In this example, it is contemplated that the selected GCU 118 is formed from sixteen (16) erasure blocks 116, with each of the erasure blocks disposed on a different die 166. Other sizes can be used as desired.

In FIG. 8, the parity data set has fifteen (15) user data pages 222, with each user data page, or payload, written to a different one of the dies. More generally, the GCU has N erasure blocks on a corresponding N dies, and payloads 222 are written to N−1 of the dies. The Nth die receives an outer code (parity value), which is represented at 224. As mentioned above, the outer code may be generated by summing the page data in a buffer using an XOR function. Because the parity data set 220 has data boundaries that nominally match the GCU boundaries, the parity data set in FIG. 8 is referred to as a standard parity data set since the data matches the available memory.

Figure 9:
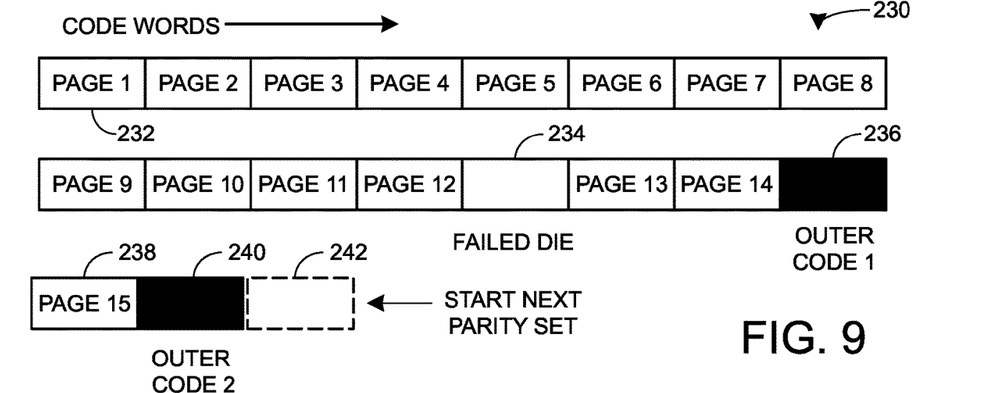
FIG. 9 is an example non-standard data set that may occur in the data storage device of FIG. 1 in accordance with various embodiments.

FIG. 9 shows an example non-standard parity data set 230. The parity data set 230 is the same size as the parity data set 220 in FIG. 8 in that, as before, the parity data set 230 has a total of fifteen (15) pages/payloads 232. However, one of the dies 166 has experienced a failure, as indicated at 234, so that the GCU only spans 15 dies.

Accordingly, the controller circuit 132 (FIG. 3) operates to write a full set of the available pages, which in this case is Page 1 to Page 14, through the available dies. This is followed by the writing of a first outer code (parity value) in the Nth location, as shown at 236, which protects the payloads (Page 1 to Page 14) written during this first pass through the available dies.

A leftover payload 238 (Page 15) is written to the next available page in the first die (such as adjacent Page 1). This leftover payload is referred to as a runt or runt data, and represents the remainder after an integer number of passes have been made through the available dies. Once all of the leftover payloads have been written, a second outer code (parity value) is written in the next available die, as shown at 240. This second outer code is disposed in the same die as, and is adjacent to, the Page 2 payload.

In this way, when leftover (runt) payload sets remain, these are written to as many additional dies as are required, followed by the writing of a final parity value to cover the runts. Map data may be generated to note the non-standard outer code arrangement. This provides a parity data set with a parity value to protect each pass through the dies, plus another parity value to cover the remainder.

While FIG. 9 shows the non-standard parity data set has arisen due to a non-standard sized available memory (e.g., due to die failure at 234), other non-standard parity data sets can arise based on other factors. For example, a particular data set to be written to a given NVMe set may make up a total number of MUs that do not align with the GCU boundaries. In another case, data compression or other processing may result in a non-standard sized parity data set. It will be appreciated that if a given GCU has N dies, then a non-standard sized data set will have a total number M payloads (or portions thereof) that are not divisible by N without a remainder. The remainder could be any value from one extra payload up to N−1 extra payloads. Regardless, each pass through the dies will be parity protected, irrespective of the overall length of the parity data set.

Once a non-standard parity set is written, map data may be generated and stored to indicate the fact that the parity data set is of non-standard length. Information may be stored in the map data such as how much longer the data set is in terms of additional pages in the remainder, the location of the last parity value (e.g., 240), etc. To maximize data density, the controller may operate to initiate the writing of the next parity data set at the next available page on the next die in the sequence, as shown at 242 in FIG. 9.

Figure 10:
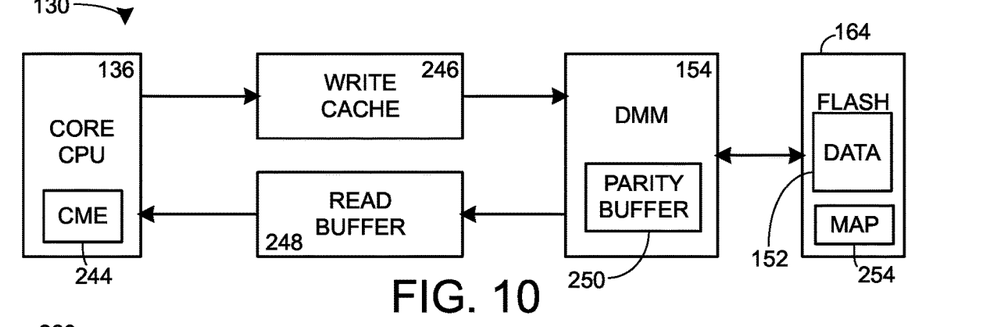
FIG. 10 shows a functional block representation of an example data storage device configured in accordance with some embodiments.

FIG. 10 shows a functional block representation of additional aspects of the SSD 130. The core CPU 136 from FIG.

3 is shown in conjunction with a code management engine (CME) 244 that can be used to manage the generation of the respective code words and outer code parity values for both standard and non-standard parity data sets During write operations, input write data from the associated host are received and processed to form MUs 180 (FIG. 5) which are placed into a non-volatile write cache 246 which may be flash memory or other form(s) of non-volatile memory. The MUs are transferred to the DMM circuit 154 for writing to the flash memory 164 in the form of code words that contain user data, inner code, and outer code. During read operations, one or more pages of data are retrieved to a volatile read buffer 248 for processing prior to transfer to the host.

The CME 244 determines the appropriate inner and outer code rates for the data generated and stored to memory. In some embodiments, the DMM circuit 154 may generate both the inner and outer codes. In other embodiments, the DMM circuit 154 generates the inner codes (see e.g., LDPC circuit 160 in FIG. 3) and the core CPU 136 generates the outer code words. In still other embodiments, the same processor/controller circuit generates both forms of code words. Other arrangements can be used as well. The CME 244 establishes appropriate code rates for both types of code words.

During generation of the outer codes, a parity buffer 250 may be used to successively XOR each payload being written during each pass through the dies. Both payload data 252 and map data 254 will be stored to data locations in flash 164.

Figure 11:
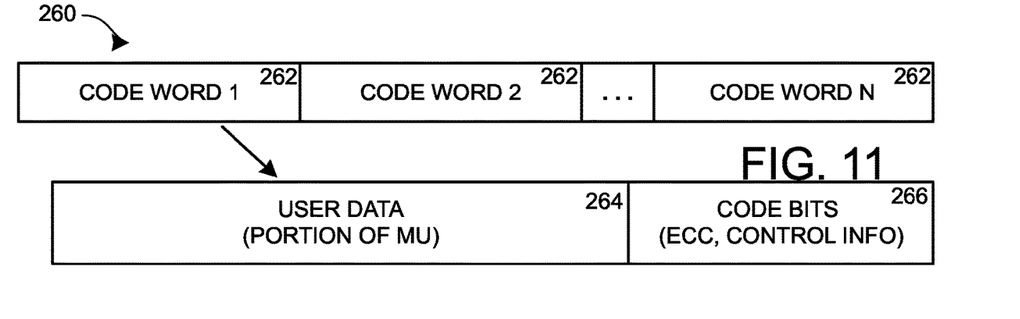
FIG. 11 displays a block representation of portions of an example data storage device arranged in accordance with assorted embodiments.

FIG. 11 is a block representation of portions of an example data storage device 260 in which data is arranged into a plurality of code words 262 that can efficiently be stored, and retrieved, from one or more SSD storage destinations. A page 150 of data may comprise a number of consecutive, or non-consecutive, code words 262 organized to effectively fit in the available space of an SSD.

As shown, a code word 262 can consist of user data 264 and inner code 266 generated to complement the user data 264, such as by the LDPC circuitry 138. The inner code 266 can provide a diverse variety of capabilities, such as error correction via error correction code (ECC), data status, data offset, and other data control information. The combination of user data 264 and inner code 266 together in a code word 262 allows for efficient analysis, verification, and correction (if necessary) of errors in reading, or writing, the user data 264 to/from memory. However, the inner code 266 may be insufficient, in some cases, to overcome and/or correct errors associated with storage of the code word 262. Hence, various embodiments generate outer code that provides higher-level data analysis and correction in complementary fashion to the inner code 266.

Figure 12:
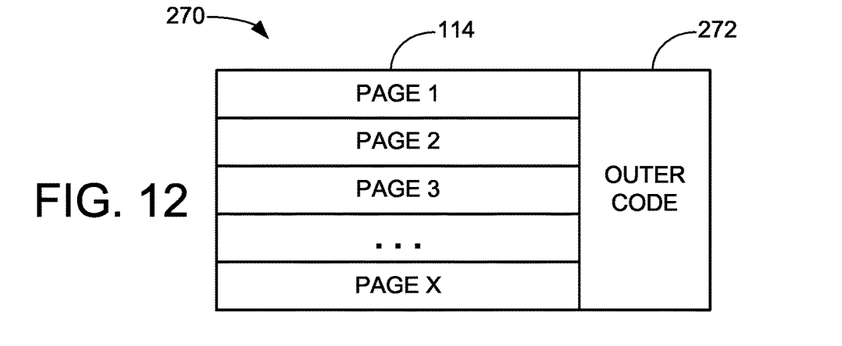
FIG. 12 shows a block representation of portions of an example data storage device configured in accordance with various embodiments.

FIG. 12 conveys a block representation of a portion of an example data storage device 270 where pages 150 of code words 262 are stored in combination with outer code 272 in accordance with some embodiments. The outer code 272 may be associated with one or more pages 150 of code words to provide data that describes the constituent code words 262 and allows for verification and correction of the accuracy, and reliability, of the user data of the respective code words 262.

It is contemplated that the outer code 272 can operate to correct errors and faults that occur during the reading, or writing, of the code words 262. Such corrective function of outer code 272 allows user data to be retrieved despite encountered errors/faults that were uncorrectable by inner code 266. In some embodiments, a probation counter for the user data and/or the physical address of memory where the user data 264 is stored is maintained in the inner code 266, outer code 272, or elsewhere in memory to allow a physical address and/or user data to be monitored in real-time with simple polling of the probation counter.

Figure 13A:
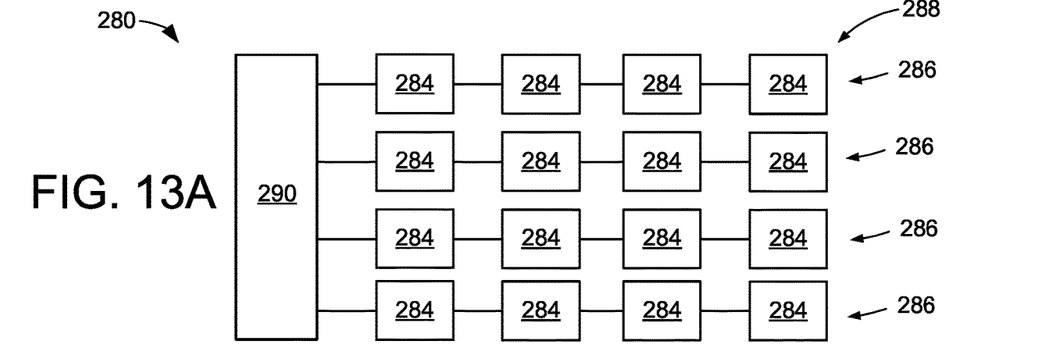
FIGS. 13A and 13B respectively convey structural and operational portions of an example distributed data storage system in which various embodiments can be practiced.
Figure 13B:
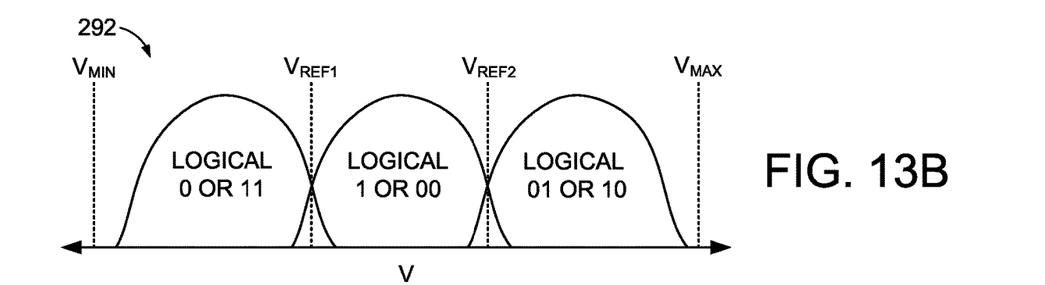

The ability to correct and recover from encountered error during data access operations to a memory provides additional longevity and reliability for a memory and the data stored therein. However, this ability comes at a relatively high system resource price as processing, storage capacity, and time are expended to correct errors and recover data. The use of such system resources can jeopardize the data storage and retrieval performance for some, or all, of a distributed data storage system. FIGS. 13A and 13B respectively convey aspects of an example distributed data storage system 280 that has encountered an error 282 to at least one portion of memory, such as an individual memory cell 284, page of cells 286, or die of many pages 288, as shown in FIG. 13A.

A local, or remote, controller 290 can detect the error 284 occurrence and conduct one or more correction and/or recovery operations to overcome the error 284. It is noted that correction operations may not be necessary if the memory does not have degraded performance or operation. Recovery operations may be directed by the controller 290 to ensure the data stored in the memory is accurate and unaltered. The presence of several errors 284 to memory cells can prompt the controller 290 to conduct memory correction that may involve cells being tested and evaluated to determine a proper Vref setting to differentiate between data bits stored in the cell.

FIG. 13B illustrates an example memory correction graph where an initial Vref setting 292 has become stale and no longer accurately bifurcates between two data bit values (0/1). While a single level memory cell is depicted in FIG. 13B, such arrangement is not required or limiting as a multi-level cell can be employed in memory and corrected by testing and evaluating Vref settings. Through the calibration of the Vref setting to correct a cell, or alteration of one or more other cell operational parameters, a memory cell can experience numerous data access errors over time without becoming unusable. However, the scanning, testing, correcting, and recovery of memory cells and/or data is resource intensive and can degrade system data performance, particularly when many dies 288 of memory are concurrently being employed to store data.

Figure 14:
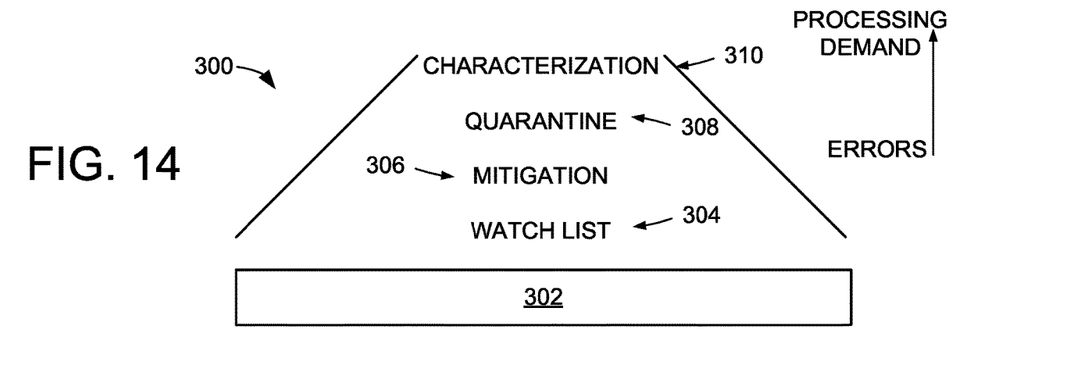
FIG. 14 depicts aspects of the operation of an example distributed data storage system operated in accordance with assorted embodiments.

Hence, the previous protocol for handling errors in a memory have been unintelligent and rather crude mechanisms for providing memory for use in balance with providing optimal data access performance. FIG. 14 depicts a block representation of an example intelligent error management protocol 300 arranged and operated in accordance with assorted embodiments. The protocol 300 can be attended by a quarantine module 302 that employs at least one controller that detects and tracks the presence of errors in at least one memory of a distributed data storage system. The quarantine module 302 may track at least the location, type, and duration of an error as well as the actions taken to correct an error.

The detection of errors may be particularly tracked based on a selected granularity, such as by memory cell, page, die, GCU, and device. The ability to track errors with variable granularity allows system resources to be available during times of high data access requests and/or background memory operations to maintain optimal data access performance. For instance, a static granularity for error-tracking can employ system resources that would otherwise provide the greatest data access performance. Thus, the quarantine module 302 can select, and adapt, which granularity to track errors to ensure system resources are available. It is noted that the tracking of errors may encompass several different granularities, such as tracking errors by page will provide information about errors on a die, GCU, and device granularities.

The dynamic error-tracking granularity can be used by the quarantine module 302 to identify when a particular aspect of memory is encountering elevated numbers of errors. That is, the quarantine module 302 can set threshold numbers of errors for various portions of memory to trigger the module 302 to elevate the portions of memory into a watch list status 304. As a non-limiting example, different portions of a GCU may experience a number of errors over a timespan selected by the quarantine module 302 sufficient to prompt the module 302 to assign a watch list status 304 to the GCU. It is contemplated that the watch list status 304 entails heightened error tracking from the quarantine module 302, such as smaller granularity and/or faster error detection refreshing and may, in some embodiments, alter the type of data being stored in the memory, such as security or other sensitive data.

The heightened monitoring of a portion of memory with a watch list status 304 can correspond with a different threshold of newly encountered data access errors. If less than the threshold of errors is encountered, the quarantine module 302 can evict the portion of memory from the watch list status 304. However, if more than the threshold number of errors are experienced while the portion of memory has a watch list status 304, one or more mitigation actions can be taken as the portion of memory is labeled with a mitigation status 306. A mitigation action is not limited to a particular activity, but can entail the movement of some, or all, current versions of data from the portion of memory, the erasure of the entire portion of memory, and/or the exclusion of physical block addresses of the memory from new data storage. It is noted that some mitigation actions can involve corollary actions, such as altering the outercode to accommodate excluded physical block addresses.

While assorted mitigation actions are occurring, or present, the portion of memory remains available to store new data and supply stored data to satisfy data read requests. Hence, the portion of memory having the mitigation status 306 is not quarantined from access or use, but is instead engaged in one or more mitigation actions directed to cull the occurrence of new errors on the portion of memory. The mitigation action(s) can be fruitful and new errors are maintained below a mitigation threshold of errors set by the quarantine module 302, which can prompt the promotion of the portion of memory to the watch list status 304 or into the general memory population with no heightened error monitoring or correction.

Yet, experiencing additional new errors that exceed the mitigation threshold set by the quarantine module 302 causes the portion of memory to receive quarantine status 308 where no data access is provided to the portion of memory. It is contemplated that data may be initially moved or copied from the portion of memory prior to being quarantined. The quarantine status 308 for a portion of memory allows for an in-drive characterization status 310 to be obtained for at least some of the constituent physical block addresses. Such in-drive characterization can scan, test, evaluate, calibrate, and/or alter one or more memory cells. As a result, the Vref of various memory cells can be validated or changed to better provide reliable, accurate data access performance. The ability to conduct the characterization in-drive means the data storage device controller can carry out the characterization of memory cells as prescribed by the quarantine module, which decreases the processing impact of such activities on overall distributed data storage system performance.

If new errors above a scan threshold set by the quarantine module 302 are subsequently encountered after the activities associated with the in-drive characterization of memory, the quarantine module 302 can permanently disable the portion of memory or keep the quarantined designation while new memory characterizations are conducted. If the in-drive characterization are successful in reducing new errors below the scan threshold, the quarantine module 302 can erase the portion of memory to allow all excluded cells to be activated and the memory grows into its original size.

Figure 15:
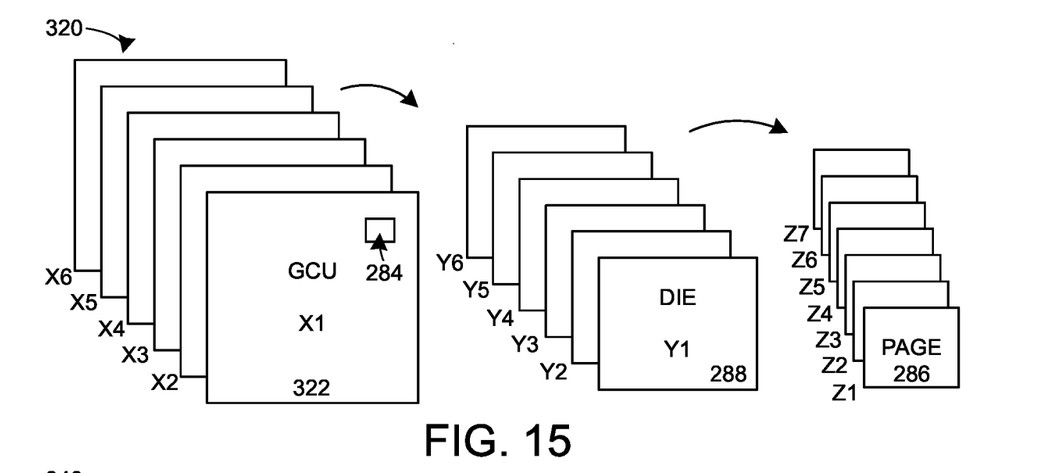
FIG. 15 depicts portions of an example distributed data storage system arranged and utilized in accordance with some embodiments.

FIG. 15 depicts a block representation of portions of a distributed data storage system 320 in which assorted embodiments can be practiced. A number of different GCUs 322 are illustrated and correspond with different ranges of physical block addresses associated with constituent memory cells 284. A plurality of dies 288 can contain a number of individually addressable pages 286, erasure blocks, and memory cells.

With the plurality of separate GCUs 322, die 288, and pages 286 all receiving different volumes of data access requests and incurring errors at different times, a local, or remote, data storage controller can track the number of incurred errors for the respective GCUs (X1-X6), die (Y1-Y6), and pages (Z1-Z7). It is contemplated that the logged errors (X/Y/Z) may be cumulative over the operational life of the memory or correspond to a specific timespan, such as since the last reset of the memory, the previous hour, or previous day. Along with the time in which errors are tracked, a quarantine module 302 can dictate different error tracking granularities. For instance, a GCU granularity can maintain the assorted GCU error counts (X1-X6) without tracking the errors to an individual die or page. In another example, error tracking can have a page granularity where the number of encountered errors for accesses to each page of a die, plane, GCU, and/or memory can be monitored and logged.

By selecting different error tracking granularities, a quarantine module 302 can allocate sufficient system resources to understand when actions need to be made to optimize data access performance without committing unnecessary and wasteful system resources to error tracking. The ability to switch error tracking granularity allows a quarantine module 302 to adjust to changing system conditions by increasing, or decreasing, the amount of system resourced dedicated to accurately monitoring and logging errors for particular portions of memory.

Figure 16:
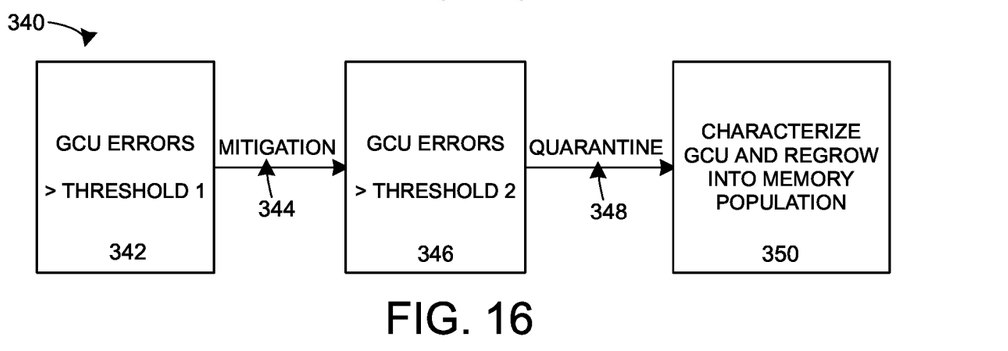
FIG. 16 depicts a block representation of the operation of an example distributed data storage system in accordance with various embodiments.

FIG. 16 depicts a block representation of example operation of a distributed data storage system configured in accordance with various embodiments. Initially, a quarantine module sets a GCU level granularity for a memory and begins logging the number of errors for various GCU. While the number of errors remains below a watch list threshold number (threshold 1), the quarantine module can conduct minimally invasive operations as normal memory operation and maintenance are conducted, such as data reads, data writes, garbage collection, error recovery, and memory voltage calibration.

When the number of errors for a GCU reaches the watch list threshold in step 342, the entire GCU is assigned a watch list status and the physical block addresses of the errors are noted by the quarantine module. Those physical block addresses are subsequently monitored specifically while the overall number of GCU errors are also tracked. If the noted addresses continue to have errors within a timeframe set by the quarantine module, all current versions of data in the GCU are relocated in step 344 to a new GCU. Conversely, if no further errors are encountered to the monitored addresses, the quarantine can evict the GCU from the watch list.

Regardless of whether the specifically monitored addresses receive additional errors, if the entire GCU has a number of errors that exceeds a quarantine threshold number set by the quarantine module in step 346, portions of the GCU are removed from operation in the quarantine operation of step 348, such as an individual memory cell, data block, page, plane, or die. Once in quarantine, some, or all, of the GCU can be characterized by an in-drive process where the reference voltage for at least one memory cell is tested and adjusted to optimize data access performance and reliability. It is contemplated that each memory cell of the GCU has an optimized reference voltage at the conclusion of step 350, but such operation is not required as less than all the GCU can be tested for reference voltage, as directed by the quarantine module.

The characterization of the entire GCU can correspond with a reset of each constituent memory cell in step 350 as any portions of the GCU taken out of operation are reintroduced into an operational state as the GCU grows its operational data capacity. In the event errors persist during or after step 350, the quarantined portions of the GCU can be permanently deactivated, the GCU can be reconstructed by the quarantine module, or the purpose of the GCU can be adjusted so that less sensitive and performance-demanding data is stored therein.

Figure 17:
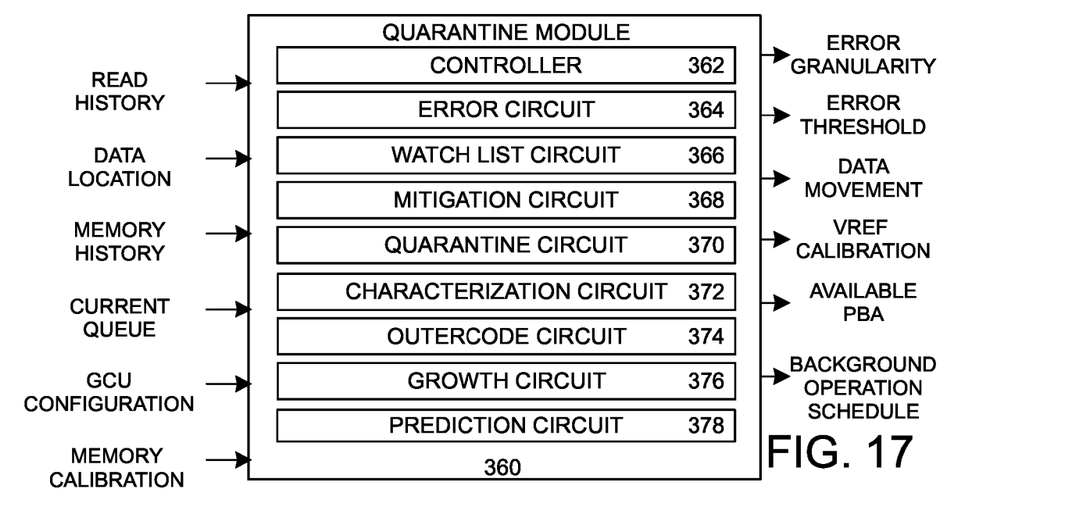
FIG. 17 depicts a block representation of an example quarantine module that can be utilized by the various embodiments of FIGS. 1-16 in accordance with some embodiments.

FIG. 17 depicts a block representation of an example quarantine module 360 that can be employed in a distributed data storage system in accordance with assorted embodiments. The quarantine module 360 can utilize one or more local controllers 362, such as a microcontroller, microprocessor, or other programmable circuitry. It is contemplated that the quarantine module 360 may utilize an existing system controller, such as a data storage device controller, network node controller, or host controller, to conduct some, or all, of the processing of the module 360. The ability to employ a variety of controllers 362 allows the quarantine module 360 to access larger amounts of processing than if it relied on a single controller.

The module controller 362 can direct operation of various error tracking, memory watch lists, memory quarantine, reference voltage characterization, and data relocation with at least inputting data read history, data location, memory error history, GCU configuration, pending data accesses, and current reference voltage calibrations for at least one memory. As a result of the various inputs, the module controller 362 can select and adjust error tracking granularity, error thresholds, the movement of data, the available physical addresses (PBA) in a memory, the calibration of reference voltages, and the schedule of normal background operations.

While the module controller 362 may translate any, or all, of the inputs into the assorted chosen memory parameters shown in FIG. 17, embodiments arrange the quarantine module 260 with hardware circuitry that assists the controller 362 with various processing operations. An error circuit 364 can aid in the tracking of errors to specific portions of memory, such as GCU, die, planes, erasure blocks, and pages. The error circuit 364 may select one or more error granularities based on detected, or predicted, processing needs and/or error rates for a memory.

A watch list circuit 366 can operate to monitor and track portions of memory that have watch list status. The watch list circuit 366 may conduct heightened scrutiny of particular portions of memory, such as physical block addresses in a GCU. The watch list circuit 366 may be complemented by a mitigation circuit 368 that generates and executes one or more mitigation actions, such as relocating current versions of data. The mitigation circuit 368 may also conduct one or more memory operations, such as refreshing, erasure, or test data writing, to configure a portion of memory for potential future quarantine and in-drive characterization operations.

The module controller 362 can task quarantine error threshold generation and adaptation to a quarantine circuit 370 that may additionally remove portions of memory from operation in response to a quarantine status. Activation of the quarantine circuit 362 can trigger a characterization circuit 372 to carry out in-drive reference voltage recalibration for at least one memory cell.

In the event a portion of memory is removed from available data capacity, an outercode circuit 374 can adjust the outercode, data mapping, and/or forward pointers to accommodate a smaller data capacity. For instance, quarantining of a GCU with a die of memory removed from operation prompts the outercode circuit 374 to adjust the memory outercode to make the removed die inaccessible to a host. Once a characterization of memory is conducted and removed portions of memory are to be reintroduced into available data capacity, a growth circuit 376 can conduct the adjustment of memory into an operational state, such as directing outercode modification, modifying address tables, and storing memory calibrations.

The assorted circuitry of the quarantine module 360 can operate in a reactionary manner to detected errors and system conditions. However, a prediction circuit 378 may forecast one or more errors, error locations, error times, and results of various error tracking and quarantining operations. That is, the prediction circuit 378 can analyze one or more hypothetical system adjustments, such as error tracking granularity, memory quarantining, and data relocation, for the likely system performance and security consequences. With those predicted hypothetical results, the module controller 362 can more intelligently select error tracking granularity, error thresholds, and when background operations are to be scheduled.

Figure 18:
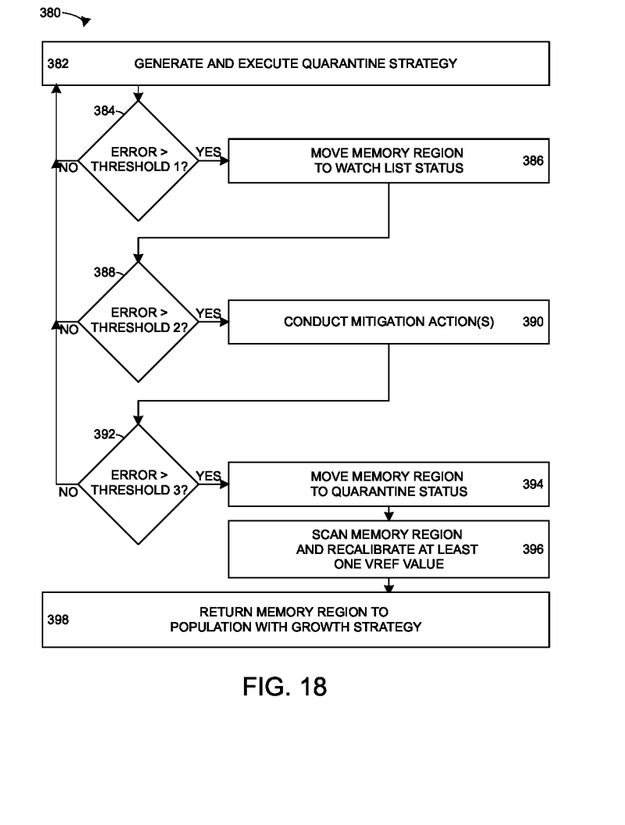
FIG. 18 is a flowchart of an example quarantine routine that can be carried out by the assorted embodiments of FIGS. 1-17.

FIG. 18 conveys an example quarantine routine 380 that can be carried out by a quarantine module as part of a distributed data storage system in accordance with some embodiments. A quarantine strategy is generated in step 382 by a quarantine module in response to the detection, and/or prediction, of one or more system conditions, such as GCU configuration, memory reference voltage calibration, and pending data access operations. A quarantine strategy is not limited to specific actions, parameters, and schedules, but various embodiments have a strategy prescribing at least error tracking granularity, threshold error values for watch list, mitigation, and quarantine, and in-drive memory characterization settings.

The quarantine strategy proceeds to track errors to the designated portions of memory while decision 384 evaluates if a first error threshold set by the strategy has been reached. If so, step 386 assigns a watch list status where individual addresses of errors are monitored, which corresponds with greater error tracking granularity. The continued presence of errors can prompt decision 388 to determine if a mitigation threshold number of errors has been reached. Errors in excess of the mitigation threshold triggers step 390 to conduct one or more mitigation actions, such as relocate all current versions of data, copying the entire portion of memory, or execute garbage collection of stale data.

It is noted that the continued presence of errors for a memory has not prompted memory to be taken offline or otherwise made unavailable, which allows system resources to be focused on satisfying data access requests and security protocol while portions of memory have incremental progression towards quarantine. That is, execution of steps 382-390 can be occupy small volumes of processing power that only slightly degrades overall system data access performance all while conducting actions that can mitigate the occurrence of errors and any quarantine operations that jeopardize the performance, reliability, and security of the system. Hence, if the portion of memory does not reach the mitigation error threshold value in decision 388, routine 380 returns to the execution of the quarantine strategy while removing the watch list status.

However, if errors persist after one or more mitigation actions to reach a quarantine threshold, decision 392 assigns a quarantine status in step 394 and proceeds to conduct an in-drive characterization of data where one or more memory scans are done to recalibrate at least one reference voltage value in step 396. While not required, any portions of memory taken out of service during routine 380 can be returned to an operational state in step 398 through the execution of a growth strategy that involves reconfiguring at least the outercode of memory to allow host access to the previously deactivated memory cells.

It is noted that there is a tradeoff between tracking failures and errors at a lowest granularity versus at a higher granularity. It is contemplated that a quarantine characterization feeds a memory calibration process where more scrutiny is applied to problem areas, such as with multiple scans, tests, and reference voltage calibrations. In some cases, new calibration groups may be based on a logged quarantine history. As such, there is a sequential process in which problem areas of memory receive a succession of attention and actions where problem areas are isolated and dealt with separately. Overall, fewer and less rigorous memory scans will be needed as memory testing and calibration will be triggered by errors in particular locations, instead of throughout a logical grouping, such as a GCU.

What is claimed is:

1. An apparatus comprising:
a non-volatile memory; and
a quarantine module, connected to the non-volatile memory, configured to generate a quarantine strategy in response to a pending data access request to the non-volatile memory;
the quarantine strategy proactively prescribing a plurality of status levels for physical data addresses of the non-volatile memory; and
the quarantine module further configured to alter a status level of the plurality of status levels for a physical data address of the non-volatile memory in response to a volume of errors for the physical data address compared to a threshold number of errors, as directed by the quarantine strategy.

2. The apparatus of claim 1, wherein:
the physical data addresses of the non-volatile memory form a garbage collection unit (GCU) of the non-volatile memory that is allocated and erased as a unit;
the altering of the status level by the quarantine module includes placing the GCU on a watch list to provide heightened monitoring of error rate performance of the physical data address while the GCU continues to service data access requests; and
the quarantine module comprises a prediction circuit configured to predict the volume of errors for the physical data address.

3. The apparatus of claim 2, wherein:
the GCU is a first GCU and the physical data address constitutes a first portion of the first GCU;
the quarantine module is further configured to:
migrate valid from the first GCU to a different, second GCU within the non-volatile memory;
perform an erase operation upon the first GCU to reset memory cells therein;
reduce an overall data storage capacity of the first GCU by excluding the first portion of the GCU while using remaining portions of the first GCU to service data access requests;
scan the first portion of the first GCU to reset at least one reference voltage; and
reincorporating the first portion back into the first GCU responsive to the reseting of the at least one reference voltage; and
the quarantine module further comprises an error circuit configured to alter an error granularity in response to an error rate of the non-volatile memory.

4. The apparatus of claim 1, wherein the quarantine module comprises a characterization circuit configured to conduct an in-drive reference voltage recalibration for at least one memory cell of the non-volatile memory as directed by the quarantine strategy, the at least one memory cell of the non-volatile memory at the physical data address.

5. The apparatus of claim 4, wherein the in-drive reference voltage recalibration is carried out using a controller of a data storage device in which the non-volatile memory resides while the at least one memory cell of the non-volatile memory at the physical data address has been temporarily quarantined from use to store user data.

6. A method comprising:
connecting a non-volatile memory to a quarantine module;
generating a quarantine strategy in response to a pending data access request to the non-volatile memory, the quarantine strategy proactively prescribing a plurality of status levels for physical data addresses of the non-volatile memory;
comparing a first volume of errors for the non-volatile memory to a first threshold of the quarantine strategy using the quarantine module, the first volume of errors generated responsive to servicing of a first set of data access requests by the non-volatile memory;
altering a first status level of the plurality of status levels for a first physical data address of the non-volatile memory, as directed by the quarantine strategy, in response to the comparison of the first volume of errors to the first threshold;
comparing a second volume of errors for the non-volatile memory to a second threshold of the quarantine strategy using the quarantine module, the second volume of errors generated responsive to servicing of a second set of data access requests by the non-volatile memory; and
changing a second status level of the plurality of status levels for a second physical data address of the non-volatile memory, as directed by the quarantine strategy, in response to the comparison of the second volume of errors to [[a]] the second threshold, the first and second status levels conducted concurrently by the quarantine module.

7. The method of claim 6, wherein the first status level increases an error detection refresh rate for the first physical data address.

8. The method of claim 6, wherein the first status level increases an error detection granularity for the non-volatile memory.

9. The method of claim 6, wherein the quarantine module alters the first status level to a different third status level for the first physical data address in response to the first threshold of the quarantine strategy.

10. The method of claim 9, wherein the third status level conducted concurrently with the second status level.

11. The method of claim 9, wherein the third status level involves execution of at least one mitigation action to decrease an error rate for the first physical data address.

12. The method of claim 9, wherein the quarantine module alters the second status level to a different fourth status level for the first physical data address in response to a third threshold of the quarantine strategy.

13. The method of claim 12, wherein the fourth status level involves recalibrating a reference voltage for the first physical data address.

14. The method of claim 12, wherein the fourth status level involves reassigning a type of data stored in the first physical data address.

15. The method of claim 12, wherein the fourth status level involves generating and executing a growth strategy with the quarantine module, the growth strategy involves reconfiguring at least the outercode of data stored in the first physical data address.

16. The method of claim 12, wherein:
the non-volatile memory is arranged into a plurality of garbage collection units (GCUs) each separately allocated and erased as a unit;
the first physical data address forms a first portion of a first GCU;
the second physical data address forms a second portion of the first GCU; and
the quarantine module is further configured to:
migrate valid data from the first GCU to a second GCU;
direct an erasure operation upon the first GCU to provide a refreshed first GCU;
use the second portion of the refreshed first GCU to service data requests; and
scan the first portion of the refreshed first GCU to reset at least one reference voltage.

17. A method comprising:
connecting a non-volatile memory to a quarantine module;
generating a quarantine strategy in response to a pending data access request to the non-volatile memory, the quarantine strategy proactively prescribing a plurality of status levels for physical data addresses of the non-volatile memory;
predicting an expense of a volume of system resources with the quarantine module;
comparing the predicted expense of the volume of system resources to a first threshold of the quarantine strategy with the quarantine module; and
altering a first status level of the plurality of status levels for a first physical data address of the non-volatile memory, as directed by the quarantine strategy, in response to the comparison of the expense of the volume of system resources to the first threshold.

18. The method of claim 17, wherein the volume of system resources is a percentage of processing capability for the non-volatile memory.

19. The method of claim 17, wherein the expense of the volume of system resources is predicted from a combination of error rate and pending data access requests for the non-volatile memory.

20. The method of claim 17, wherein the first status level decreases system resources used to track errors in the non-volatile memory.

* * * * *